United States Patent [19]

Hornschuh

[11] Patent Number: 5,462,836
[45] Date of Patent: Oct. 31, 1995

[54] METHOD OF MANUFACTURING A FLEXOGRAPHIC PRINTING PLATE

[76] Inventor: Manfred Hornschuh, Hauptstrasse 4, D-49174 Hilter, Germany

[21] Appl. No.: 212,969

[22] Filed: Mar. 15, 1994

[30] Foreign Application Priority Data

Mar. 16, 1993 [DE] Germany ............... 43 09 258.6

[51] Int. Cl.$^6$ ................................................. G03F 7/00
[52] U.S. Cl. .................. 430/306; 430/22; 101/463.1; 101/483; 101/DIG. 36
[58] Field of Search ................ 430/22, 300, 306; 101/463.1, 483, DIG. 36

[56] References Cited

U.S. PATENT DOCUMENTS 4,809,609 3/1989 Sugiura ............................ 101/426

FOREIGN PATENT DOCUMENTS 2179890 3/1987 United Kingdom.

OTHER PUBLICATIONS

Patent Abstracts of Japan vol. 012, No. 354 (P–761) of Sep. 22, 1988 and JP–A–63 106 756 (Sono Kogyo KK) of May 11, 1988.

*Primary Examiner*—Kathleen Duda
*Attorney, Agent, or Firm*—Friedrich Kueffner

[57] ABSTRACT

A method of manufacturing a flexographic printing plate having a base (polyester foil) and a soft caoutchouc mass which is enriched with photo-initiators (photo-polymer) and is arranged on the base, wherein a film with the image to be printed is fastened with precise fit on a free surface portion of the caoutchouc mass. The method includes removing the caoutchouc mass at the edges of the base intended for fastening. The base is provided with register holes in the areas of the exposed edges of the base and the base is placed with the register holes on register pins of an assembly rail. Spacer pieces are placed on the exposed edges of the base, wherein the thickness of the spacer pieces corresponds to the thickness of the removed caoutchouc mass. A film having corresponding register holes is placed on the register pins. Finally, exposure to light, washing and assembly in the printing machine are carried out.

5 Claims, 2 Drawing Sheets

METHOD OF MANUFACTURING A FLEXOGRAPHIC PRINTING PLATE

BACKGROUND OF THE INVENTION

1. Field of the Invention

The present invention relates to a method of manufacturing a flexographic printing plate having a base (polyester foil) and a soft caoutchouc mass which is enriched with photo-initiators (photo-polymer) and is arranged on the base, wherein a film with the image to be printed is fastened with precise fit on a free surface portion of the caoutchouc mass.

2. Description of the Related Art

Methods of the above-described type are basically known for the preparation of a flexographic printing method, which is a letter press printing method. In this method, printing ink is transferred to the printing plate. The printing plate transfers the ink under printing pressure in the printing machine to the material to be printed.

Available printing plate materials are vulcanized rubber plates, lasered rubber plates and lasered, rubber-coated cylinders, as well as photo-polymeric plates and cylinders coated with photo-polymeric layers.

Two systems of photo-polymeric printing plates are known on the market, i.e., the liquid system and the solid system.

In quality flexographic printing, predominantly solid plates are used whose market share is approximately 65% according to data provided by manufacturers.

An extremely soft caoutchouc mass enriched with photoinitiators is extruded in a thickness of 0.513 mm to 6.223 mm onto a polyester foil having a thickness of 0.127 mm to 0.229 mm and the surface of the caoutchouc mass is homogenized by means of calendars with total tolerances of ±10 µm.

By adding the thicknesses of the base and of the polymer, printing plates having total heights of between 0.640 mm and 6.350 mm are produced.

For manufacturing the printing plate so as to be ready for printing, a right reading mat negative is required in which the portions to be printed later are permeable to light. The film and the photo-polymeric unfinished plate are exposed to ultraviolet light under vacuum in an ultraviolet light exposing device. By means of the penetrating ultraviolet light, the permeable portions in the film harden the portions of the plate which later transfer the ink. The non-exposed portions are washed out in a washer, so that the portions to be printed later are present on the plate laterally reversed and raised.

As a rule, the flexographic printing machines have six or eight printing mechanisms, so that it is possible to print with six or eight colors in one step of operation. All colors which are to be printed in one step of operation must fit together. In order to make the arrangement of colors relative to each other possible, concentrically arranged register marks are provided to the left and right of the printed image.

In this method, it is attempted to arrange all register marks of all six or eight color printing forms so as to essentially coincide. The register mark of the first color is positioned by means of mirror systems or by means of video cameras and the register marks of the subsequent plates are aligned in accordance with the first register mark.

Methods in which the holes are drilled or punched into the finished printing plate through hardened polymer and through the base also utilize register marks for positioning.

Because of the high compressibility, also of the already hardened polymer, the resiliency of the plate itself makes it impossible to achieve exactly reproducible holes. In the case of plate thicknesses of 0.64 and 0.76 mm, a relief of 0.513 mm or 0.633 mm is present between the printing surface and the base. In all other printing plates, the relief depth between the printing surface and the polymer base are between 0.8 and 1.5 mm. Because printing portions alternate with non-printing portions, an area-parallel placement for the drilling or punching procedure is not possible.

The plate is resilient because of the different thicknesses. Moreover, polymer residues adhere to the tool and, as a result, increase the size of the respective hole in the base.

The registers of conventional printing methods, i.e., offset printing and gravure printing, are 0.050 to 0.100 m. In the present state of the art, an accurate assembly for offset printing is not possible in flexographic methods.

In the film manufacture of conventional methods, the reprotechnical registers are achieved by punching. In other words, the unexposed film is punched in a film puncher immediately after the removal from the film dispenser and is placed in an assembly rail with raised register pins and is possibly brought into contact with an already exposed, also punched film, and is then exposed to light. The accuracy to fit is not achieved by means of assembled register marks, but through the above-described punched hole system with accuracies of ±10 µm.

The offset printing plate copying method operates in accordance with the same principle of punched holes between film and plate and the assembly through register pins.

The flexographic method operates in the manufacture of films also by means of film punching. However, the final film is already no longer punched because in the past it was not possible to further use punched final films with punched unfinished plates to be exposed to light.

The plate thicknesses which are used in flexographic methods vary between 0.644 and 6.35 mm.

The degrees of hardness between the unfinished plates and between the finished plates are also subject to extreme variations. In the unfinished plates, the degrees of hardness vary between 8° Shore-A and 19° Shore-A, and in the finished plates, i.e., after exposure to light and after treatment, the degrees of hardness are approximately between 42° and 65° Shore-A.

The soft unfinished plate makes it impossible to carry out punching or drilling with accurate fit. The punching and drilling procedure alone would damage the extremely soft polymer mass on the base when a tool is placed on the polymer mass and the printing plate would become useless as a result. During any drilling procedure as well as any punching procedure, the soft polymer would not permit an exact borehole within a mass or in the base. Polymer portions would be deposited on the outer side of the tool during the drilling or punching procedure and would pull a portion of this mass in drilling direction through to the base.

The material in the drilling location sags down. This makes an exact guidance of the register pin impossible because the holes in the base as well as the holes of the polymer are no longer round or accurate.

SUMMARY OF THE INVENTION

Therefore, it is the primary object of the present invention to provide a method of the above-described type which makes it possible to arrange the film on the printing plate and to assemble the finished printing plate in the printing machine with accurate fit and the required tolerances by means of assembly rails and register pins.

In accordance with the present invention, the caoutchouc mass is removed at the edges of the base intended for fastening. The base is provided with register holes in the areas of the exposed edges of the base and the base is placed with the register holes on register pins of an assembly rail. Spacer pieces are placed on the exposed edges of the base, wherein the thickness of the spacer pieces corresponds to the thickness of the removed caoutchouc mass. A film having corresponding register holes is placed on the register pins. Finally, exposure to light, rinsing and assembly in the printing machine are carried out.

The method according to the present invention makes it possible to use the registers of conventional printing methods, such as offset printing or gravure printing, for the accurate assembly in flexographic printing methods.

In accordance with a preferred feature of the present invention, a thermal knife is used for removing the caoutchouc mass at the edges of the base to be punched. This feature makes it possible to punch the thin and hard base exactly and with accurate fit. The spacer pieces then make it possible to arrange the film which includes the image. After exposure to light and finishing of the printing plate, the printing plate can be mounted with accurate fit in the printing machine.

Accordingly, the present invention is directed to a method which makes it possible for the first time to expose to light the caoutchouc mass with accurate fit by punching the unfinished plate and, following the finishing process, to mount the washed and aftertreated plate under stress, i.e., under pressure.

In addition to increasing the manufacturing accuracy, the time required for mounting the plate is reduced by about 75%. The accuracy to fit of the mounted cylinders, which in the present state of the art of plate mounting is on average between 0.3 mm and 0.8 mm, will be reduced by the novel method to values between 0.05 and 0.1 mm.

In a machine constructed for this purpose, the unfinished photo-polymeric printing plate to be exposed to light later is fixed under vacuum and against a stop. The thickness of the polymer layer on the base and the hardness of the polymer are being sensed.

From the data of the measured polymer amount and of the hardness of the polymer, a computer determines the energy required for the cutting or severing process and for the advancing process.

However, the cutting head in the form of flat edged or rotating round masses is preferably a thermal knife.

An electronically controlled, thermal cutting unit lifts the material from the base in dependence on the specification of the polymer with respect to thickness and hardness.

Cooling of the cutting knife can be carried out separately. However, cooling is preferably effected by the lifted and remaining material itself. The energy for the thermal cutting unit is determined in such a way that, coupled with the rate of advancement of the cutting knife, the material is melted only in the immediate zone of contact of the material, while the material is simultaneously severed. This ensures that sticking or burning of the crude polymer material is prevented.

The cutting knife can be advanced manually or by means of a motor. Preferably, the advancement is effected pneumatically. The pneumatic drive adjusts the applied force in such a way that the thermal cutting head releases energy only in the forward cutting zone of contact and with such an energy that the material in this zone can be melted and simultaneously severed. After severing, the pneumatic pressure causes the knife to be advanced further directly and permanently. Thus, the zone in front of the thermal knife is still cold, while the zone behind the knife is already cooled again to such an extent that the temperature of the material is below the melting point thereof.

The melting process of the thermal knife smoothens the remaining material at the cutting edge. This prevents the release of polymer residues which would be deposited on the plate in a harmful manner.

The base from which the sticky soft polymer mass has been removed, can be punched in the same commercially available film punching unit which is used for punching the negative.

The length of the commercially available assembly rail must be extended to correspond to the thickness of the polymer plate, i.e., 0.76 to 6.35 mm. The plate to be exposed to light later is placed with exact fit in the assembly rail modified in this manner, wherein a spacer piece having the thickness of the removed polymer provides parallelism between the unfinished plate to be exposed to light and the side with the punched holes. After the punched negative has been received, the plate can be exposed to light under vacuum exactly and with accurate fit. The caoutchouc mass enriched with photo-initiators may a have a thickness of 0.5 mm to 6.3 mm and the base may have a thickness of between 0.12 mm and 0.23 mm. The caoutchouc mass may be extruded onto the base. A calender may be used for homogenizing or smoothing the caoutchouc mass.

The novel method according to the present invention makes it possible for the first time to expose film and unfinished plate to light with exact fit and to mount the plate with accurate fit using the same technology.

In a suitable mounting unit, a lower die to be newly provided in accordance with the present invention and having the same arrangement of holes as the punching unit, is introduced, positioned and fixed in a groove line.

The holes of the polymer-free base of the washed plate are received by an upper die having the same arrangement of pins as the punching unit.

The upper die with the plate suspended therein is introduced into the lower die. As a result, the printing plate is exactly positioned and can be mounted for the first time under stress, i.e., with the same application of pressure as it is used later in the printing machine.

The method according to the present invention makes it possible for the first time to assemble under stress and, also for the first time, to provide exactly equal developments of all plates of a six-color or eight-color printing form.

The various features of novelty which characterize the invention are pointed out with particularity in the claims annexed to and forming a part of the disclosure. For a better understanding of the invention, its operating advantages, specific objects attained by its use, reference should be had to the drawing and descriptive matter in which there are illustrated and described preferred embodiments of the invention.

DETAILED DESCRIPTION OF THE PREFERRED EMBODIMENTS

Figure 1:
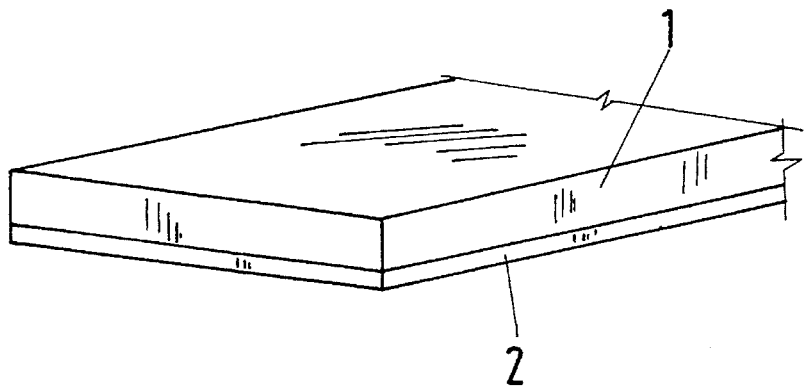
FIG. 1 is a schematic perspective view of a flexographic printing plate prior to exposure to light and processing.

FIG. 1 of the drawing shows a high flexographic printing plate which is composed of a caoutchouc mass 1 (crude polymer) and a base 2 (polyester foil). The polyester foil is relatively hard and the caoutchouc mass has a softness as it is conventional for carrying out flexographic printing methods.

Figure 2:
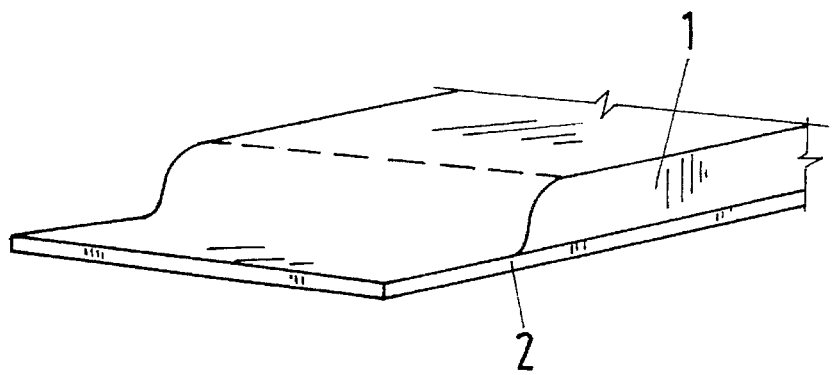
FIG. 2 is a perspective view of a printing plate, corresponding to FIG. 1, but after removal of the caoutchouc mass at an edge of the base.

In a first step of operation, the polyester mass is thermally removed in an edge portion 3, so that a printing plate is produced as it is shown in FIG. 2.

Figure 3:
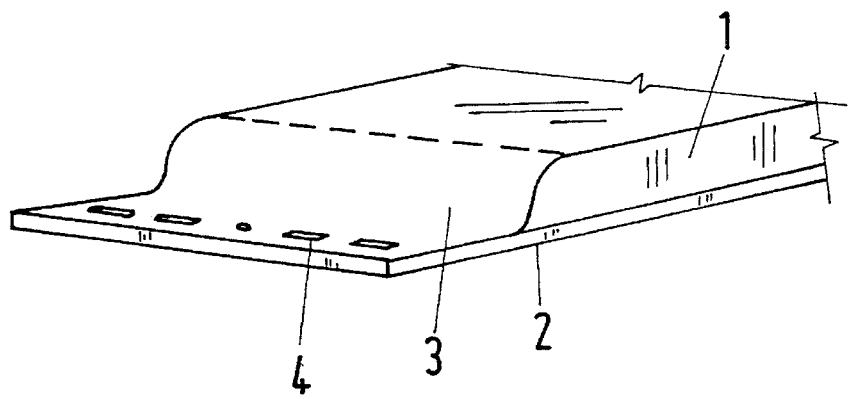
FIG. 3 is a perspective view corresponding to FIGS. 1 and 2 after register holes have been punched into the respective edge portion.

As shown in FIG. 3, register holes 4 are punched into the edge portion. The product obtained in this manner is placed on register pins 5 of an assembly rail 6.

Figure 4:
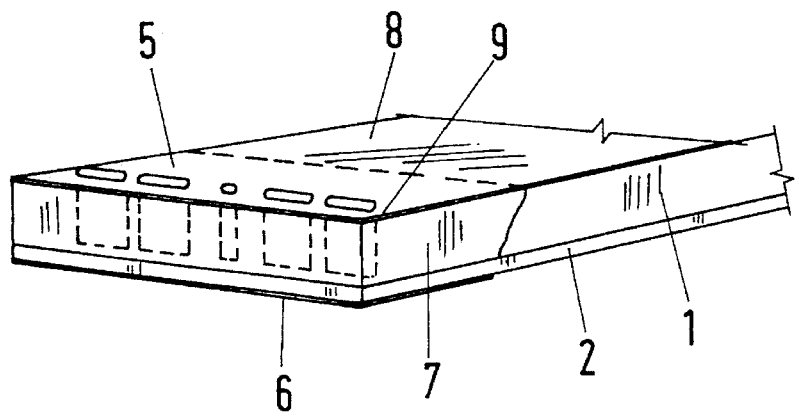
FIG. 4 is a perspective view of a printing plate placed on register pins and with a film including the image to be printed.

Subsequently, as shown in FIG. 4, spacer pieces 7 are placed on the edge portion, so that the film 8 with its register holes 9 can be placed flat on the surface of the caoutchouc mass 1. The register pins 5 project upwardly above the surface.

By applying a vacuum to the caoutchouc mass, the film 8 can be held immovably during the exposure procedure which now takes place.

The printing plate exposed in this manner is then washed in the conventional manner, so that those portions which are to receive printing ink project in a relief-like manner.

The finished flexographic printing plate is then mounted preferably under stress, i.e., under pressure, in the printing machine, also by means of appropriate register pins. For printing different colors, an appropriate number of flexographic printing plates are produced, which, as a result of the exact punching, arrangement and assembly thereof by means of the register pins, produce a printed image with the necessary high accuracy.

Figure 5:
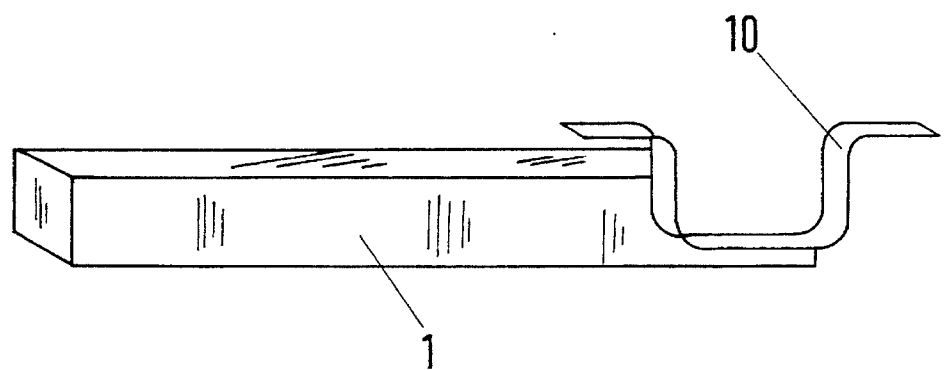
FIG. 5 is a perspective side view of a printing plate with a thermal knife shown during the severing process.
Figure 6:
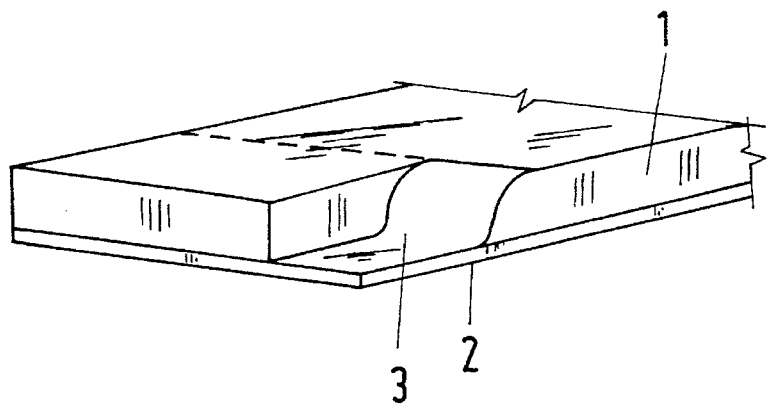
FIG. 6 is a schematic top view of the printing plate shown in FIG. 5.

FIGS. 5 and 6 of the drawings schematically show how a thermal knife 10 removes the appropriate portion of the caoutchouc mass in an edge portion thereof. The control of the thermal knife and the supply of energy to the thermal knife are effected, after determining and scanning the appropriate parameters, by means of a computer which especially determines the temperature and the rate of advance and controls the thermal knife accordingly.

The invention is not limited by the embodiments described above which are presented as examples only but can be modified in various ways within the scope of protection defined by the appended patent claims.

I claim:

1. A method of manufacturing a flexographic printing plate, the printing plate having a base, a soft caoutchouc mass enriched with photo-initiators, the caoutchouc mass being arranged on the base, and a film with the image to be printed being fastened on the caoutchouc mass with a precise fit, the method comprising removing the caoutchouc mass at edges of the base intended for fastening the film, providing the edges of the base from which the caoutchouc mass has been removed with register holes and placing the base with the register holes on register pins of an assembly rail, placing spacer pieces on the edges of the base from which the caoutchouc mass has been removed, wherein the thickness of the spacer pieces corresponds to the thickness of the removed caoutchouc mass, placing the film having corresponding register holes on the register pins, and finally carrying out exposure to light and rinsing of the film.

2. The method according to claim 1, wherein the caoutchouc mass enriched with photo-initiators has a thickness of 0.5 mm to 6.3 mm and the base has a thickness of between 0.12 mm and 0.23 mm, further comprising extruding the caoutchouc mass onto the base and smoothing the caoutchouc mass by means of a calender.

3. The method according to claim 1, comprising removing the caoutchouc mass at the edges of the base by means of an electronically controlled thermal knife, scanning the thickness of the caoutchouc mass on the base and the hardness of the caoutchouc mass, and using a computer for determining from the scanned thickness of the caoutchouc mass and from the hardness an energy required for removing the caoutchouc mass and for an advancement of the thermal knife.

4. The method according to claim 3, comprising cooling the thermal knife.

5. The method according to claim 3, comprising cooling the thermal knife with a separate cooling means.

\* \* \* \* \*